United States Patent [19]

New

[11] Patent Number: 5,898,319

[45] Date of Patent: Apr. 27, 1999

[54] METHOD AND STRUCTURE FOR PROVIDING FAST CONDITIONAL SUM IN A FIELD PROGRAMMABLE GATE ARRAY

[75] Inventor: Bernard J. New, Los Gatos, Calif.

[73] Assignee: Xilinx, Inc., San Jose, Calif.

[21] Appl. No.: 08/853,975

[22] Filed: May 9, 1997

Related U.S. Application Data

[63] Continuation-in-part of application No. 08/494,131, Jun. 23, 1995, Pat. No. 5,629,886, which is a continuation-in-part of application No. 08/310,113, Sep. 20, 1994, Pat. No. 5,481,206, which is a continuation-in-part of application No. 08/116,659, Sep. 2, 1993, Pat. No. 5,349,250.

[51] Int. Cl.$^6$ ............................... H03K 19/177
[52] U.S. Cl. ............................... 326/41; 326/38
[58] Field of Search ............................... 326/37, 38, 39, 326/40, 41

[56] References Cited

U.S. PATENT DOCUMENTS

| | | | |
|---|---|---|---|
| 4,124,899 | 11/1978 | Birkner et al. | 364/716 |
| 4,706,216 | 11/1987 | Carter | 365/94 |
| 4,758,745 | 7/1988 | Elgamal et al. | 307/465 |
| 4,870,302 | 9/1989 | Freeman | 307/465 |
| 5,198,705 | 3/1993 | Galbraith et al. | 307/465 |
| 5,258,668 | 11/1993 | Cliff et al. | 307/465 |
| 5,260,611 | 11/1993 | Cliff et al. | 307/465 |
| 5,267,187 | 11/1993 | Hsieh et al. | 364/784 |
| 5,280,202 | 1/1994 | Chan et al. | 307/465 |
| 5,287,472 | 2/1994 | Horst | 365/189 |
| 5,317,210 | 5/1994 | Patel | 326/40 |
| 5,332,929 | 7/1994 | Chiang | 365/189 |
| 5,343,406 | 8/1994 | Freeman et al. | 364/490 |
| 5,349,250 | 9/1994 | New | 307/465 |
| 5,352,940 | 10/1994 | Watson | 365/189 |
| 5,386,156 | 1/1995 | Britton et al. | 326/37 |
| 5,396,127 | 3/1995 | Chan | 326/40 |
| 5,414,377 | 5/1995 | Freidin | 326/41 |
| 5,451,887 | 9/1995 | El-Ayat | 326/39 |
| 5,483,478 | 1/1996 | Chiang | 364/787 |
| 5,487,025 | 1/1996 | Partovi et al. | 364/788 |
| 5,508,952 | 4/1996 | Kantabutra | 364/787 |
| 5,546,018 | 8/1996 | New et al. | 326/38 |
| 5,629,886 | 5/1997 | New | 364/787 |

FOREIGN PATENT DOCUMENTS

| | | |
|---|---|---|
| A0456475A2 | 11/1991 | European Pat. Off. . |
| A0569135A2 | 7/1993 | European Pat. Off. . |
| A0607657A1 | 7/1994 | European Pat. Off. . |
| WO 95/06979 | 3/1995 | WIPO . |

OTHER PUBLICATIONS

Xilinx Programmable Gate Array Data Book, 1989, pp. 6–30 through 6–44, available from Xilinx, Inc., 2100 Logic Drive, San Jose, California 95124.

C. Lytle "FLEX Programmable Logic: Largest Density PLD", COMPCON Spring '93, Digest of Papers, Feb. 22–26 1993, IEEE, Computer Society Press, New York, pp. 355–361.

*Primary Examiner*—Michael Tokar
*Assistant Examiner*—Daniel D. Chang
*Attorney, Agent, or Firm*—Edel M. Young

[57] ABSTRACT

A carry logic circuit for a field programmable gate array (FPGA) which allows a carry input signal to be propagated through the carry logic circuit without passing through a multiplexer of another series connected circuit element. The carry logic circuit uses a function generator of the FPGA to provide a propagate signal in response to first and second input signals provided to the carry logic circuit. Also described are methods for performing a carry logic function in an FPGA.

7 Claims, 8 Drawing Sheets

METHOD AND STRUCTURE FOR PROVIDING FAST CONDITIONAL SUM IN A FIELD PROGRAMMABLE GATE ARRAY

RELATED APPLICATIONS

The present application is a continuation-in-part of U.S. patent application Ser. No. 08/494,131, filed Jun. 23, 1995 now U.S. Pat. No. 5,629,886, entitled METHOD AND STRUCTURE FOR PROVIDING FAST PROPAGATION OF A CARRY SIGNAL IN A FIELD PROGRAMMABLE GATE ARRAY" which is a continuation-in-part of U.S. Pat. application Ser. No. 08/310,113 now U.S. Pat. No. 5,481,206 entitled "CIRCUIT FOR FAST CARRY AND LOGIC" by Bernard J. New and Kerry M. Pierce, filed on Sep. 20, 1994, which is a continuation-in-part of commonly owned, U.S. patent application Ser. No. 08/116,659, entitled "LOGIC STRUCTURE AND CIRCUIT FOR FAST CARRY", filed Sep. 2, 1993, issued as U.S. Pat. No. 5,349,250 on Sep. 20, 1994, all of which are incorporated by reference in their entirety.

FIELD OF THE INVENTION

The present invention relates to a carry logic structure for use in a field programmable gate array (FPGA).

DISCUSSION OF THE RELATED ART

FPGAs typically use logic circuits to perform various a binary arithmetic function, such as addition. FIG. 1 is a diagram of a typical carry logic circuit 1. Carry logic circuit 1, which includes carry circuitry 2 and sum circuitry 3, receives three input signals $A_i$, $B_i$ and $C_i$ and provides two output signals $S_i$ and $C_{i+1}$. Carry logic circuit 1 can implement various arithmetic operations, including the addition of two digital numbers represented by input signals $A_i$ and $B_i$. When adding input signals $A_i$ and $B_i$, input signal $C_i$ is used as a carry signal which has a digital value which represents the result of the addition of two bits at a previous bit position. Output signal $S_i$ is a digital value which represents the sum of input signals $A_i$, $B_i$ and $C_i$. Output signal $C_{i+1}$ is a digital value corresponding to the carry result of the addition of input signals $A_i$, $B_i$, and $C_i$. Table 1 is a truth table defining an addition operation within carry logic circuit 1.

TABLE 1

| $A_i$ | $B_i$ | $C_i$ | $S_i$ | $C_{i+1}$ |
|---|---|---|---|---|
| 0 | 0 | 0 | 0 | 0 |
| 0 | 0 | 1 | 1 | 0 |
| 0 | 1 | 0 | 1 | 0 |
| 0 | 1 | 1 | 0 | 1 |
| 1 | 0 | 0 | 1 | 0 |
| 1 | 0 | 1 | 0 | 1 |
| 1 | 1 | 0 | 0 | 1 |
| 1 | 1 | 1 | 1 | 1 |

Logic circuit 1 has been implemented within FPGAs using various logic structures. FIG. 2A is a schematic diagram of a conventional carry logic circuit. Input signals $A_i$ and $B_i$ are routed through control logic 12 to a hard-wired exclusive OR gate 14. This circuit is also discussed in U.S. Pat. No. 5,267,187, incorporated herein by reference. The output terminal of exclusive OR gate 14 is coupled to the control terminal of multiplexer 16. Multiplexer 16 receives an input signal (typically either the $A_i$ or $B_i$ signal) on one input terminal. The other input terminal of multiplexer 16 is coupled to receive a carry input signal $C_i$ from a previous carry logic circuit (not shown). The carry signal $C_{i+1}$ routed through multiplexer 16 is provided to a subsequent carry logic circuit (not shown) as a carry input signal $C_i$. Signals $A_i$, $B_i$ and $C_i$ are provided to function generator 18 of the FPGA. In response, function generator 18 generates sum signal $S_i$, which is equal to $A_i$ XOR'ed with $B_i$, XOR'ed with $C_i$.

FIG. 2B is a schematic diagram of another conventional carry logic circuit. Logic unit 11 includes three two-input logic gates XOR gate 13, OR gate 15, and AND gate 17, which generate the XOR, OR, and AND functions respectively of input signals $A_i$ and $B_i$. XOR gate 13 provides the half sum $P_i$. Multiplexer 16 selects one of the AND and OR functions of input signals $A_i$ and $B_i$ as determined by carry-in signal $C_i$. When $C_i$ is logic 0, multiplexer 16 selects the output of AND gate 17, which is logic 1 only when $A_i$ and $B_i$ are both logic 1. Thus multiplexer 16 carry output $C_{i+1}$ is logic 1 when $C_i$ does not indicate a carry but both input signals are logic 1. When carry input signal $C_i$ is logic 1, the carry output $C_{i+1}$ is logic 1 if either input is logic 1. Thus the structure of FIG. 12 is another structure for generating fast carry signals.

To provide a circuit which adds digital numbers having a plurality of bits, a plurality of carry logic circuits are typically coupled together in a serial manner, such that the carry signal $C_{i+1}$ provided by each carry logic circuit is propagated to a subsequent carry logic circuit as a carry input signal $C_i$. In the carry logic circuit of FIG. 2A, carry signal $C_{i+1}$ is created by routing a signal (either the $A_i$ or $B_i$ input signal or carry input signal $C_i$) through multiplexer 16. Multiplexer 16 delays the propagation of carry signal $C_{i+1}$. In the carry logic circuit of FIG. 2B, carry signal $C_{i+1}$ is created by routing the selected AND or OR function of the input signals to the output of multiplexer 16. As in FIG. 2A, multiplexer 16 delays the propagation of carry signal $C_{i+1}$.

For each additional carry logic circuit connected in series, additional carry signal propagation delay is introduced by an additional multiplexer.

It would therefore be desirable to have a carry logic circuit for use in an FPGA which reduces carry signal propagation delay.

SUMMARY

Accordingly, the present invention provides an FPGA having at least one carry logic circuit having two carry chains. One carry chain is initiated with logic 0 and the other is initiated with logic 1. The two chains extend for several bit positions, for example four bit positions. A multiplexer at the end is controlled by a carry-in signal to select between the two carry chains.

This carry logic circuit includes a first input lead coupled to receive a first input signal (Ai), a second input lead coupled to receive a second input signal (Bi), a first carry chain lead coupled to receive a first carry chain signal (CAi), a second carry chain lead coupled to receive a second carry chain signal (CBi), a third carry chain lead, a fourth carry chain lead, a carry input lead coupled to receive a carry input signal (Ci), and a local carry input lead for providing a local carry input signal (Ci+1) to a logic forming element of another carry logic circuit.

A programmable function generator of the FPGA is coupled to the first and second input leads. The function generator is programmed to perform an exclusive OR operation. In a particular embodiment, the function generator generates the exclusive OR signal in response to the first and second input signals.

The propagate signal is provided to control a first multiplexer and a second multiplexer. The propagate signal causes the first and second multiplexers to couple the first input lead to the third and fourth carry chain leads, respectively, when and only when the first input value is equal to the second input value. The propagate signal further causes the first multiplexer to couple the first carry chain lead to the third carry chain lead and causes the second multiplexer to connect the second carry chain lead to the fourth carry chain lead when and only when the first input signal is not equal to the second input signal.

The present invention also includes a third multiplexer for coupling either the third carry chain lead or the fourth carry chain lead to the local carry input terminal (Ci+1) in response to said carry input signal (Cin). When more than one carry logic circuit is provided in accordance with the present invention, each carry logic circuit has a multiplexer corresponding to the previously described third multiplexer. In such an embodiment, each of these multiplexers is controlled by the carry input signal, which is supplied to each multiplexer in parallel.

The carry logic signal can also include a carry output lead for transmitting a carry output signal from the carry logic circuit and a carry output signal selection circuit coupled to the carry output lead, the third carry chain lead, the fourth carry chain lead and the carry input lead. In such an embodiment, the carry output selection circuit transmits a signal from either the third or fourth carry chain leads to the carry output lead in response to the carry input signal. The carry input signal is provided to the carry output signal selection circuit and the third multiplexer in parallel. As a result, the carry signal propagation delay is minimized.

In another embodiment, delay is further reduced by generating conditional sums. In this embodiment, as before, the carry logic circuit includes two carry chains and a multiplexer for selecting between the carry chains.

In contrast to the first embodiment, a first conditional sum logic gate coupled to receive a first carry chain signal (CAi), a second conditional sum logic gate coupled to receive a second carry chain signal (CBi), both conditional sum logic gates coupled to receive a propagate signal (Pi), and a select multiplexer for selecting between output signals of the conditional sum logic gates and controlled by a carry input signal of a local logic unit.

In a further embodiment, the fast conditional sum is applied to an FPGA in which the carry-out signal is generated by a multiplexer receiving inputs from the AND and OR of bit input signals and a control signal from the carry-in signal. The sum is generated as a conditional sum. One potential sum is the XOR of the two input signals and the first carry-in signal. The other potential sum is the XOR of the two input signals and the second carry-in signal.

In yet another embodiment, the carry is selected prior to generating the sum, and two carry-out signals are generated by multiplexers receiving inputs from the AND and OR of bit input signals and respective control signals from the carry-in signal on the two carry chains.

The present invention will be more fully understood in light of the following detailed description taken together with the drawings.

DETAILED DESCRIPTION OF THE PREFERRED EMBODIMENTS

Figure 3:
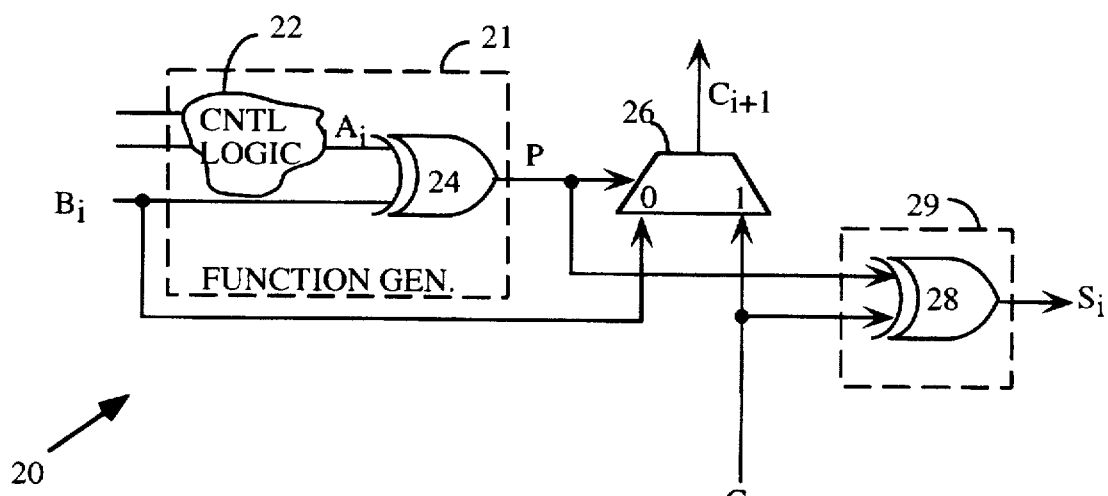
FIGS. 3 and 4 are schematic diagrams of carry logic circuits.

FIG. 3 is a schematic diagram of carry logic circuit 20 for use in an FPGA. Input signals $A_i$ and $B_i$ are provided to function generator 21 of the FPGA. Function generator 21 is programmed to implement control logic 22 and exclusive OR gate 24. The output signal of exclusive OR gate 24 is routed to the control terminal of multiplexer 26 and to an input terminal of exclusive OR gate 28. Exclusive OR gate 28 can be hard-wired (not shown) or implemented by programming another function generator 29. Input signal $B_i$ is provided to one input terminal of multiplexer 26 and carry in signal $C_i$ is provided to the other input terminal of multiplexer 26. The signal routed through multiplexer 26 is provided to a subsequent carry logic circuit (not shown) as carry signal $C_{i+1}$. Carry input signal $C_i$ is also provided to an input terminal of exclusive OR gate 28. In response, exclusive OR gate 28 provides sum signal $S_i$.

Because function generator 29 can be programmed to implement logic functions in addition to an exclusive OR, flexibility is added to carry logic circuit 20. This in turn provides flexibility to an FPGA which uses carry logic circuit 20. However, carry logic circuit 20 does not solve the problem of carry signal propagation delay.

Figure 4:
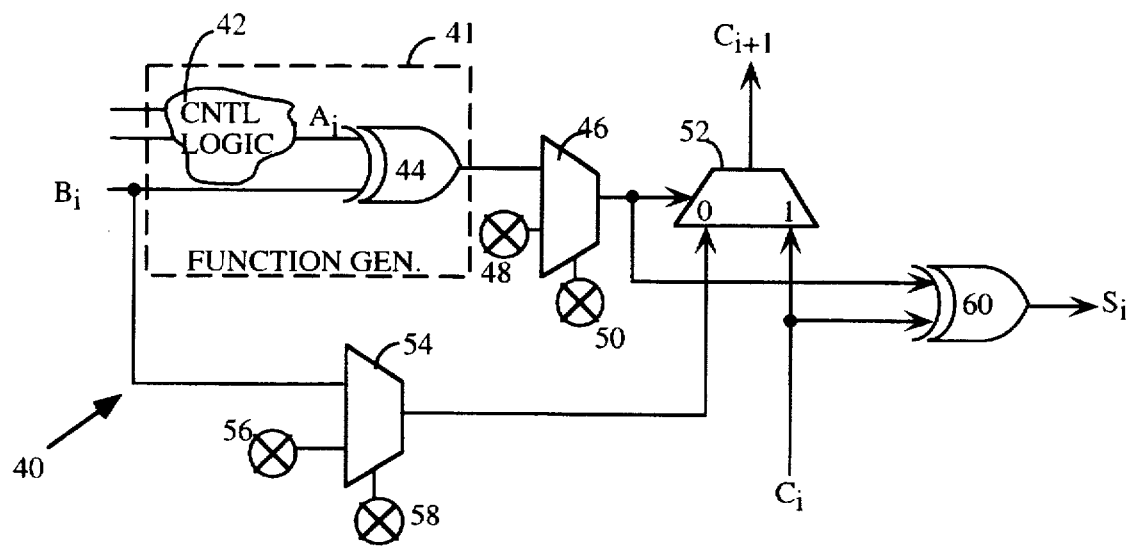

FIG. 4 is a schematic diagram of yet another carry logic circuit 40. Input signals $A_i$ and $B_i$ are provided to function generator 41 which is programmed to implement control logic 42 and exclusive OR gate 44. The output signal of exclusive OR gate 44 is provided to an input terminal of multiplexer 46. The other input terminal of multiplexer 46 is coupled to receive a signal from configurable bit latch 48. Configurable bit latch 48 is programmable to provide a logic high or logic low signal to multiplexer 46. The control terminal of multiplexer 46 is coupled to receive a signal from configurable bit latch 50.

The signal routed through multiplexer 46 is provided to the control terminal of multiplexer 52 and to an input terminal of exclusive OR gate 60. To operate carry logic circuit 40 as an adder circuit in accordance with Table 1, configurable bit latch 50 is programmed to couple exclusive OR gate 44 to the control terminal of multiplexer 52. Carry input signal $C_i$ is provided to the other input terminal of exclusive OR gate 60 and to an input terminal of multiplexer 52. The other input terminal of multiplexer 52 is coupled to multiplexer 54. Multiplexer 54 routes either input signal $B_i$ or a signal generated by configurable bit latch 56. Multiplexer 54 is controlled by a signal generated by configurable bit latch 58. To operate carry logic circuit 40 as an adder circuit in accordance with Table 1, configurable bit latch 58 is programmed to route input signal $B_i$ to multiplexer 52. The carry signal $C_{i+1}$ routed through multiplexer 52 is provided to a subsequent carry logic circuit (not shown) as a carry in signal $C_i$ of the subsequent carry logic circuit. The output signal of exclusive OR gate 60 is transmitted as sum signal $S_i$.

Because multiplexers 46 and 54 can be programmed to route predefined logic signals (provided by configurable bit latches 48 and 56), flexibility is added to carry logic circuit 40. This in turn provides flexibility to an FPGA which uses carry logic circuit 40. However, carry logic circuit 40 does not solve the problem of carry signal propagation delay.

Figure 5:
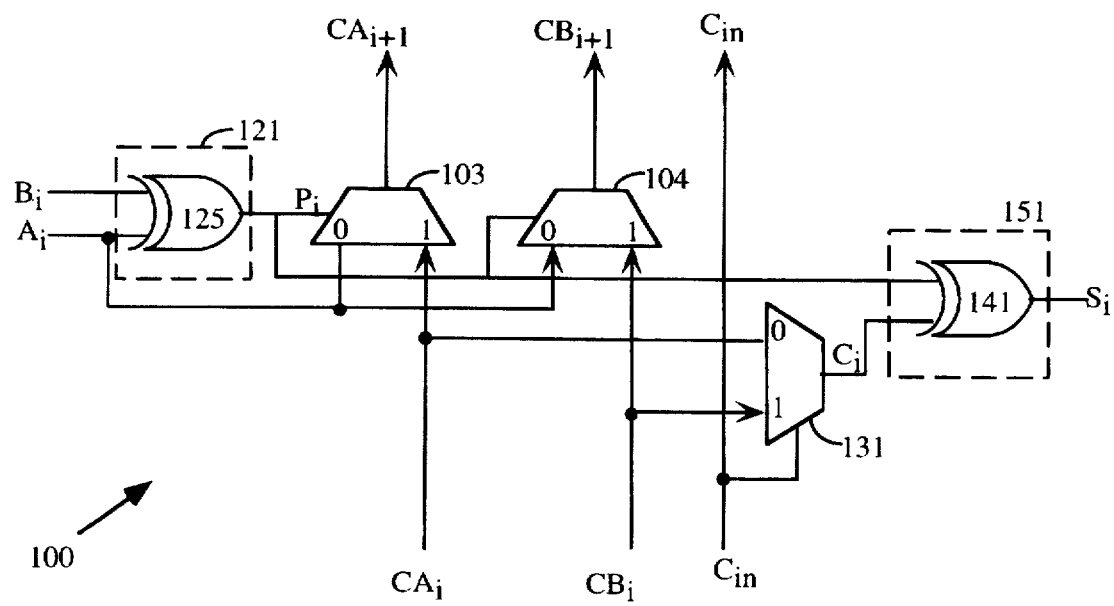
FIG. 5 is a schematic diagram of a carry logic circuit in accordance with one embodiment of the present invention.

FIG. 5 is a schematic diagram of carry logic circuit 100 in accordance with one embodiment of the present invention. Carry logic circuit 100 includes multiplexers 103, 104 and 131, function generators 121 and 151, and exclusive OR gates 125 and 141. Each of multiplexers 103, 104 and 133 has a control terminal, a "0" input terminal, a "1" input terminal and an output terminal. The signal applied to the controlterminal determines whether the "0" input terminal or the "1" input terminal is coupled to the output terminal. A logic "0" signal applied to the control terminal causes the "0" input terminal to be coupled to the output terminal, and a logic "1" signal applied to the control terminal causes the "1" input terminal to be coupled to the output terminal.

Input signals $A_i$ and $B_i$, which are typically product terms received from logic forming circuitry of an FPGA, are provided to function generator 121. Function generator 121 is a programmable circuit, such as a look-up table, which is present within a configurable logic block (CLB) of the FPGA. In the embodiment illustrated, function generator 121 is programmed to implement exclusive OR gate 125. The output signal of exclusive OR gate 125 is a propagate signal $P_i$ which is provided to the control terminals of multiplexers 103 and 104 and to an input terminal of exclusive OR gate 141. Exclusive OR gate 141 is implemented by function generator 151 of the FPGA on which carry logic circuit 100 is located. Exclusive OR gate 141 can alternatively be a hard-wired exclusive OR gate.

Input signal $A_i$ is also provided to the "0" input terminals of multiplexers 103 and 104. The "1" input terminals of multiplexers 103 and 104 are connected to receive carry chain signals $CA_i$ and $CB_i$, respectively. The signals transmitted to the output terminals of multiplexers 103 and 104 are labeled as carry chain signals $CA_{i+1}$ and $CB_{i+1}$, respectively. Carry chain signal $CA_i$ is provided to the "0" input terminal of multiplexer 131, and carry signal $CB_i$ is provided to the "1" input terminal of multiplexer 131. The control terminal of multiplexer 131 is coupled to receive express carry input signal $C_{in}$. The output terminal of multiplexer 131 is coupled to the other input terminal of exclusive OR gate 141. The signal routed from multiplexer 131 to exclusive OR gate 141 is designated as local carry input signal $C_i$. The output signal of exclusive OR gate 141 is designated as sum signal $S_i$.

Express carry input signal $C_{in}$ is transmitted through carry logic circuit 100 without passing through circuit elements, such as multiplexers, which can cause signal delay. As described in more detail below, this feature allows signals to be propagated through carry logic circuit 100 more quickly than in conventional carry logic circuits.

Figures 6, 7:
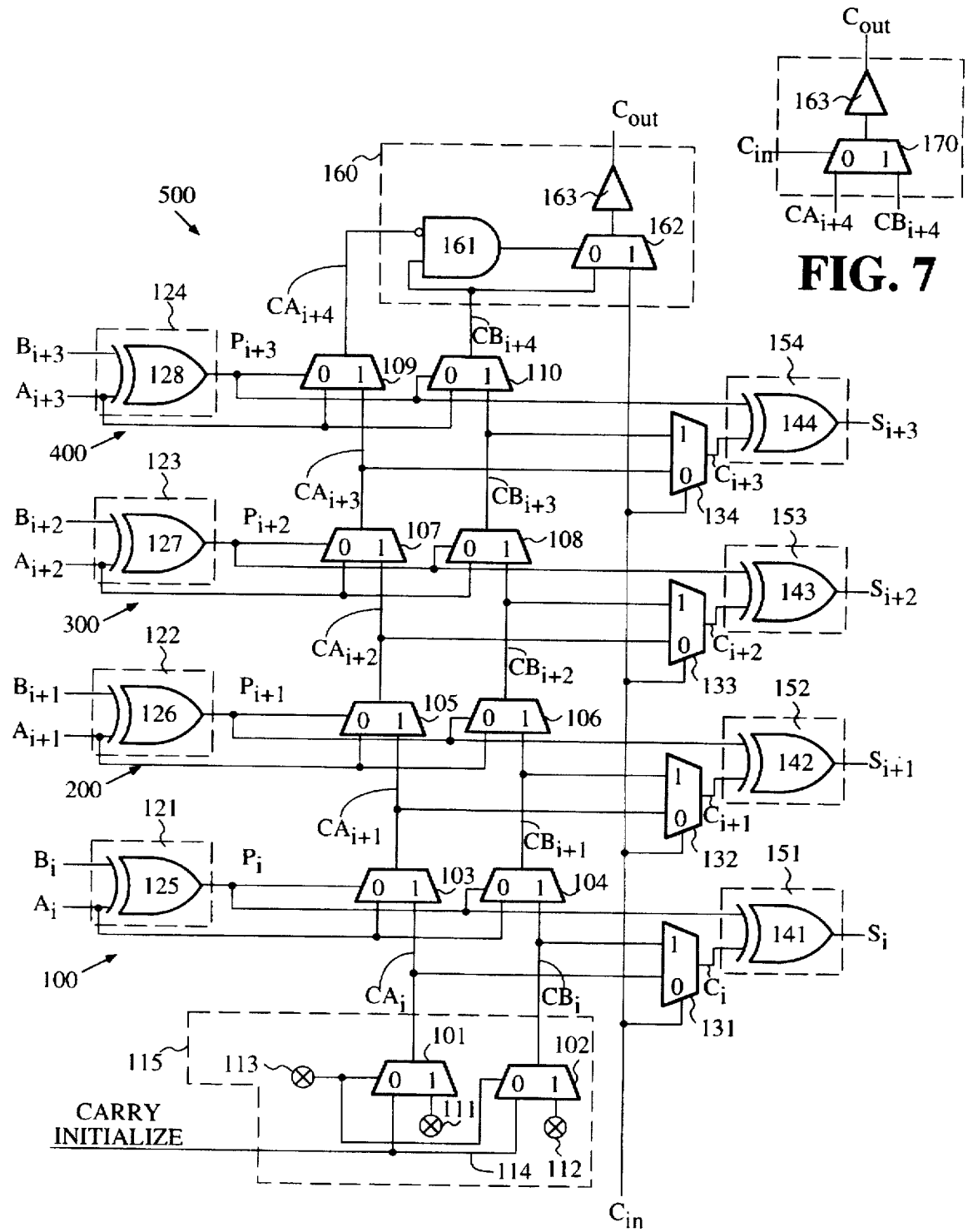
FIG. 6 is a schematic diagram of a 4-bit carry logic structure using two carry chains in accordance with one embodiment of the present invention.
FIG. 7 is a schematic diagram of an optional carry output signal selection circuit.

FIG. 6 is a schematic diagram illustrating a 4-bit carry logic structure 500 which includes four cascaded carry logic circuits 100, 200, 300 and 400. Carry logic circuits 200, 300 and 400 are each identical to carry logic circuit 100 (FIG. 5). Carry logic circuits 200, 300 and 400 include multiplexers 105–110, 132–134, function generators 122–124 and 152–154, and exclusive OR gates 126–128 and 142–144. Carry logic structure 500 also includes carry chain initialization circuit 115 and carry output signal selection circuit 160. Carry chain initialization circuit 115 includes multiplexers 101–102 and configurable bit latches 111–113. Carry output signal selection circuit 160 includes AND gate 161, multiplexer 162 and amplifying buffer 163.

Express carry input signal $C_{in}$ is provided to each of multiplexers 131–134 in parallel. Express carry input signal $C_{in}$ is also provided to carry output signal selection circuit 160. Carry output signal selection circuit 160 is the only series connected circuitry that causes significant delay in the transmission of carry output signal $C_{out}$.

Multiplexers 103, 105, 107 and 109 form a first carry chain through carry logic structure 500 and multiplexers 104, 106, 108 and 110 form a second carry chain through carry logic structure 500. Each carry chain propagates a series of carry chain signals. Thus, the first carry chain propagates carry chain signals $CA_i$, $CA_{i+1}$, $CA_{i+2}$, $CA_{i+3}$, and $CA_{i+4}$ and the second carry chain propagates carry chain signals $CB_i$, $CB_{i+1}$, $CB_{i+2}$, $CB_{i+3}$, and $CB_{i+4}$. Carry chain signals $CA_{i+2}$ and $CB_i$ are used to determine local carry signal $C_{i+3}$, carry chain signals $CA_{i+1}$ and $CB_{i+1}$ are used to determine local carry signal $C_{i+1}$, carry chain signals $CA_{i+2}$ and $CB_{i+2}$ are used to determine local carry signal $C_{i+2}$, and carry chain signals $CA_{i+3}$ and $CB_{i+3}$ are used to determine local carry signal $C_{i+3}$. Carry chain signals $CA_{i+4}$ and $CB_{i+4}$ are provided to carry output signal selection circuit 160.

Within carry output signal selection circuit 160, carry chain signal $CB_{i+4}$ is provided to the "0" input terminal of multiplexer 162 and express carry input signal $C_{in}$ is provided to the "1" input terminal of multiplexer 162. AND gate 161 is connected to receive carry chain signal $CB_{i+4}$ and the inverse of carry chain signal $CA_{i+4}$. The output terminal of AND gate 161 is connected to the control terminal of multiplexer 162. The output terminal of multiplexer 162 is connected to buffer 163. The output signal of buffer 163 is designated as carry output signal $C_{out}$. Carry output signal $C_{out}$ is provided to a subsequent carry logic structure (not shown) as an express carry input signal (such as express carry input signal $C_{in}$).

Carry logic structure 500 can be programmed to add the four least significant bits of two digital numbers. Alternatively, carry logic structure 500 can be programmed to add four bits other than the four least significant bits of two digital numbers. The programming of carry logic structure 500 is carried out by carry chain initialization circuit 115.

In carry chain initialization circuit 115, the "0" input terminals of multiplexers 101 and 102 are coupled to receive a carry initialization signal on line 114. The "1" input terminals of multiplexers 101 and 102 are coupled to receive signals from configurable bit latches 111 and 112, respectively. The control terminals of multiplexers 101 and 102 are coupled to receive a signal from configurable bit latch 113.

When configurable bit latch 113 is programmed to provide a logic "0" signal, the carry initialization signal on line 114 is transmitted through multiplexers 101 and 102 as carry chain signals $CA_i$ and $CB_i$. Thus, carry chain signals $CA_i$ and $CB_i$ are either both set to be logic "0" signals or both set to be logic "1" signals. If carry chain signals $CA_i$ and $CB_i$ are both set to be logic "0" signals, the local carry input signal $C_i$ provided within carry logic circuit 100 is effectively set to a logic "0" value, regardless of the value of the express carry input signal $C_{in}$.

Similarly, if carry chain signals $CA_i$ and $CB_i$ are both set to be logic "1" signals, then the local carry input signal $C_i$ is set to a logic "1" value regardless of the value of express carry input signal $C_{in}$.

When configurable bit latch 113 is programmed to provide a logic "1" signal, the signals programmed in configurable bit latches 111 and 112 are transmitted through multiplexers 101 and 102, respectively, as carry chain signals $CA_i$ and $CB_i$, respectively. In one configuration which uses the carry chain circuit, configurable bit latches 111 and 112 are programmed to provide logic "0" and logic "1" signals, respectively. As a result, the local carry input signal $C_i$ is set to be equal to the value of $C_{in}$. When using carry logic structure 500 to implement an adder circuit, carry chain initialization circuit 115 is not programmed such that configurable bit latches 111 and 112 provide logic "1" and logic "0" signals, respectively, as carry chain signals $CA_i$ and $CB_i$. This is because this combination of signals will cause invalid results within the adder circuit.

To implement the least significant carry logic structure of an adder circuit (i.e., the structure which adds the four least significant bits), configurable bit latch 113 is programmed to provide a logic "0" signal and the carry initialization signal is set to a logic "0" signal. As a result, carry chain signals $CA_i$ and $CB_i$ are each logic "0" signals. This initializes local carry input signal $C_i$ of carry logic circuit 100 to be a logic "0" signal. Table 2 is the truth table for carry logic circuit 100 under these conditions.

TABLE 2

Operation of Carry Logic Circuit 100
$CA_i = 0, CB_i = 0$

| $A_i$ | $B_i$ | $C_{in}$ | $P_i$ | $C_i$ | $S_i$ | $CA_{i+1}$ | $CB_{i+1}$ | $C_{i+1}$ |
|---|---|---|---|---|---|---|---|---|
| 0 | 0 | 0 | 0 | 0 | 0 | 0 | 0 | 0 |
| 0 | 0 | 1 | 0 | 0 | 0 | 0 | 0 | 0 |
| 0 | 1 | 0 | 1 | 0 | 1 | 0 | 0 | 0 |
| 0 | 1 | 1 | 1 | 0 | 1 | 0 | 0 | 0 |
| 1 | 0 | 0 | 1 | 0 | 1 | 0 | 0 | 0 |
| 1 | 0 | 1 | 1 | 0 | 1 | 0 | 0 | 0 |
| 1 | 1 | 0 | 0 | 0 | 0 | 1 | 1 | 1 |
| 1 | 1 | 1 | 0 | 0 | 0 | 1 | 1 | 1 |

Thus, carry logic circuit 100 adds input signals $A_i$, $B_i$ and $C_i$ (which is always equal to logic "0") to create sum signal $S_i$ and local carry input signal $C_{i+1}$ in a manner consistent with Table 1. Because both carry chain signals $CA_i$ and $CB_i$ are logic "0" signals, the express carry input signal $C_{in}$ has no effect on the value of sum signal $S_i$ or the value of local carry input signal $C_i$. Moreover, because carry chain signals $CA_{i+1}$ and $CB_i$ +1 always have the same value, express carry input signal $C_{in}$ has no effect on the value of local carry input signal $C_{i+1}$.

As illustrated in Table 2, when carry chain signals $CA_i$ and $CB_i$ are programmed to logic "0" values, there are only two possible combinations for carry chain signals $CA_{i+1}$ and $CB_{i+1}$. If both of carry chain signals $CA_{i+1}$ and $CB_{i+1}$ have logic "0" values, then carry logic circuit 200 operates in accordance with Table 2. Table 3 illustrates the operation of carry logic circuit 200 if both carry chain signals $CA_{i+1}$ and $CB_{i+1}$ have logic "1" values.

TABLE 3

Operation of Carry Logic Circuit 200
$CA_{i+1} = 1, CB_{i+1} = 1$

| $A_{i+1}$ | $B_{i+1}$ | $C_{in}$ | $P_{i+1}$ | $C_{i+1}$ | $S_{i+1}$ | $CA_{i+2}$ | $CB_{i+2}$ | $C_{i+2}$ |
|---|---|---|---|---|---|---|---|---|
| 0 | 0 | 0 | 0 | 1 | 1 | 0 | 0 | 0 |
| 0 | 0 | 1 | 0 | 1 | 1 | 0 | 0 | 0 |
| 0 | 1 | 0 | 1 | 1 | 0 | 1 | 1 | 1 |
| 0 | 1 | 1 | 1 | 1 | 0 | 1 | 1 | 1 |
| 1 | 0 | 0 | 1 | 1 | 0 | 1 | 1 | 1 |
| 1 | 0 | 1 | 1 | 1 | 0 | 1 | 1 | 1 |
| 1 | 1 | 0 | 0 | 1 | 1 | 1 | 1 | 1 |
| 1 | 1 | 1 | 0 | 1 | 1 | 1 | 1 | 1 |

Thus, carry logic circuit 200 adds input signals $A_{i+1}$, $B_{i+1}$ and Ci+1 (with $C_{i+1}$ being set to logic "1") to create sum signal S +1 and local carry input signal $C_{i+2}$ in a manner consistent with Table 1. Because both carry chain signals $CA_{i+1}$ and $CB_{i+1}$ are logic "1" signals, the express carry input signal $C_{in}$ has no effect on the value of sum signal $S_{i+1}$ or the value of local carry input signal $C_{i+1}$. Moreover, because carry chain signals $CA_{i+2}$ and $CB_{i+2}$ always have the same value, express carry input signal $C_{in}$ has no effect on the value of local carry input signal $C_{i+2}$.

By initializing the carry chain signals $CA_i$ and $CB_i$ to logic "0" signals, the pairs of carry chain signals which propagate between carry logic circuits in carry logic structure 500 are matched. That is, carry chain signals $CA_{i+1}$ and $CB_{i+1}$ have the same logic value, carry chain signals $CA_{i+2}$ and $CB_{i+2}$ have the same logic value, and carry chain signals $CA_{i+3}$ and $CB_{i+3}$ have the same logic value. As a result, the logic value of express carry input signal $C_{in}$ has no effect on local carry input signals $C_i$, $C_{i+1}$, $C_{i+2}$ and $C_{i+3}$.

If the carry chain signals $CA_i$ and $CB_i$ are initialized to both be logic "1" signals, local carry input signal $C_i$ is set to a logic one value. In this case, carry logic structure 500 is programmed to add a "1" value to the sum of the four bit numbers applied to structure 500.

To implement a structure which adds four bits which are not the four least significant bits of an adder circuit (e.g., the second carry logic structure of an 8-bit adder circuit), configurable bit latch 111 is programmed to provide a logic "0" signal, configurable bit latch 112 is programmed to provide a logic "1" signal and configurable bit latch 113 is programmed to provide a logic "1" signal. This effectively selects carry chain signal $CA_i$ to be a logic "0" signal and carry chain signal $CB_i$ to be a logic "1" signal. Table 4 describes the operation of carry logic circuit 100 under these conditions.

TABLE 4

Operation of Carry Logic Circuit 100
$CA_i = 0, CB_i = 1$

| $A_i$ | $B_i$ | $C_{in}$ | $P_i$ | $C_i$ | $S_i$ | $CA_{i+1}$ | $CB_{i+1}$ | $C_{i+1}$ |
|---|---|---|---|---|---|---|---|---|
| 0 | 0 | 0 | 0 | 0 | 0 | 0 | 0 | 0 |
| 0 | 0 | 1 | 0 | 1 | 1 | 0 | 0 | 0 |
| 0 | 1 | 0 | 1 | 0 | 1 | 0 | 1 | 0 |
| 0 | 1 | 1 | 1 | 1 | 0 | 0 | 1 | 1 |
| 1 | 0 | 0 | 1 | 0 | 1 | 0 | 1 | 0 |
| 1 | 0 | 1 | 1 | 1 | 0 | 0 | 1 | 1 |
| 1 | 1 | 0 | 0 | 0 | 0 | 1 | 1 | 1 |
| 1 | 1 | 1 | 0 | 1 | 1 | 1 | 1 | 1 |

Thus, carry logic circuit 100 adds input signals $A_i$, $B_i$ and $C_i$ to create sum signal $S_i$ and local carry input signal $C_{i+1}$ in a manner consistent with Table 1. Carry logic circuit 200 can receive any one of three possible combinations of carry chain signals $CA_{i+1}$ and $CB_{i+1}$. If both of carry chain signals $CA_{i+1}$ and $CB_{i+1}$ have logic "0" values, then carry logic circuit 200 operates in accordance with Table 2. If both of carry chain signals $CA_{i+1}$ and $CB_{i+1}$ have logic "1" values, then carry logic circuit 200 operates in accordance with Table 3. If carry chain signal $CA_{i+1}=0$ and carry chain signal $CB_{i+1}=1$, then carry logic circuit 200 operates in accordance with Table 4. Carry logic circuits 300 and 400 operate in the same manner as carry logic circuit 200.

Carry output signal selection circuit 160 effectively routes carry chain signal $CA_{i+4}$ as carry output signal $C_{out}$ if express carry input signal $C_{in}$ has a logic "0" value, and routes carry chain signal $CB_{i+4}$ as carry output signal $C_{out}$ if express carry input signal $C_{in}$ has a logic "1" value. Proper operation of carry output signal selection circuit 160 requires that the carry input signals $CA_i$ and $CB_i$ are not selected to be logic "1" and logic "0" signals, respectively.

FIG. 7 illustrates a multiplexer 170 which is logically equivalent to carry output signal selection circuit 160. Multiplexer 170 has a "0" input terminal coupled to receive carry chain signal $CA_{i+4}$, a "1" input terminal coupled to receive carry chain signal $CB_{i+4}$, a control terminal coupled to receive express carry input signal $C_{in}$, and an output terminal which receives carry output signal $C_{out}$. Although carry output signal selection circuit 160 is logically equivalent to multiplexer 170, carry output signal selection circuit 160 transmits carry output signal $C_{out}$ with less delay. This is because express carry input signal $C_{in}$ is not used to control multiplexer 162 in carry output signal selection circuit 160.

When a plurality of 4-bit carry logic structures are cascaded together, the carry signal delay is calculated as follows. In the initial carry logic structure, there is a slight delay introduced as the input signals are routed through the exclusive OR gates to create the propagate signals. There is also one pass gate delay per bit. This is because for each bit, a pair of carry chain signals must pass through a pair of parallel multiplexers, such as multiplexers 103 and 104. In addition, within carry output signal selection circuit 160, there is a slight delay introduced by AND gate 161 and buffer 163, and one pass gate delay introduced by circuit multiplexer 162. However, in each additional carry logic structure, the carry signal delay is equal to the pass gate delay introduced by circuit 162 and the delay introduced by buffer 163. This is because the multiplexers in the carry chains of each of the coupled carry logic structures settle concurrently. By the time that the initial carry logic structure transmits the carry output signal $C_{out}$ to a subsequent carry logic structure, the multiplexers of the subsequent carry logic structure have settled. Consequently, the multiplexers of the carry chain of the subsequent carry logic structure do not significantly contribute to carry signal delay.

Consequently, carry logic structure 500 is capable of performing as a conventional adder circuit, while providing reduced propagation delay for the carry output signal $C_{out}$.

Figure 8:
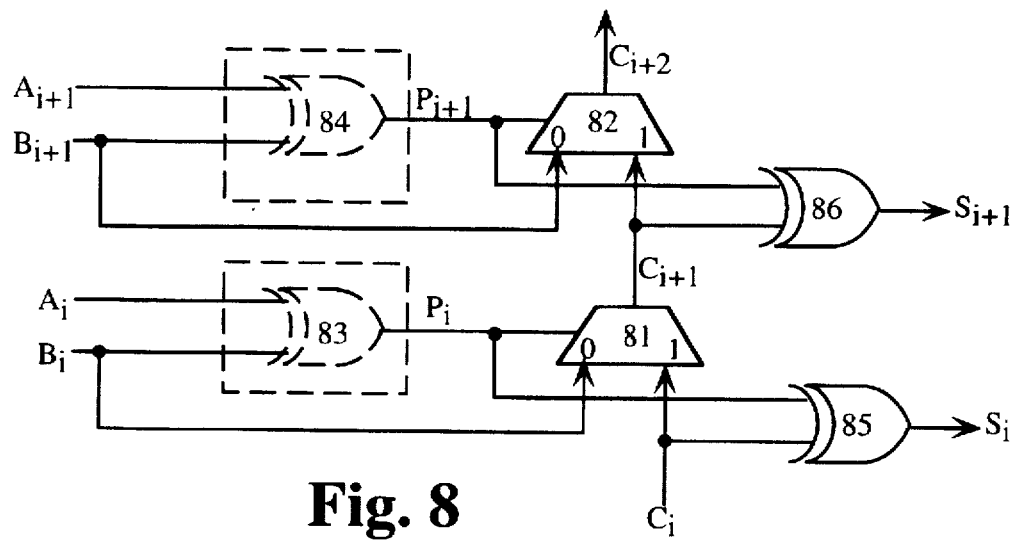
FIGS. 8–10 show schematic diagrams of alternative embodiments of the carry out circuit of the invention.
Figure 9:
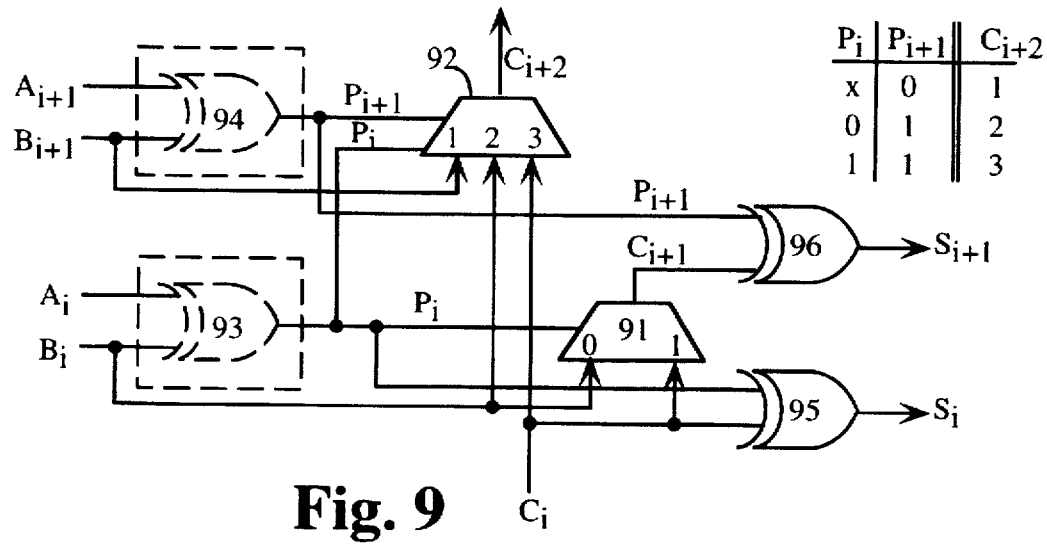
Figure 10:
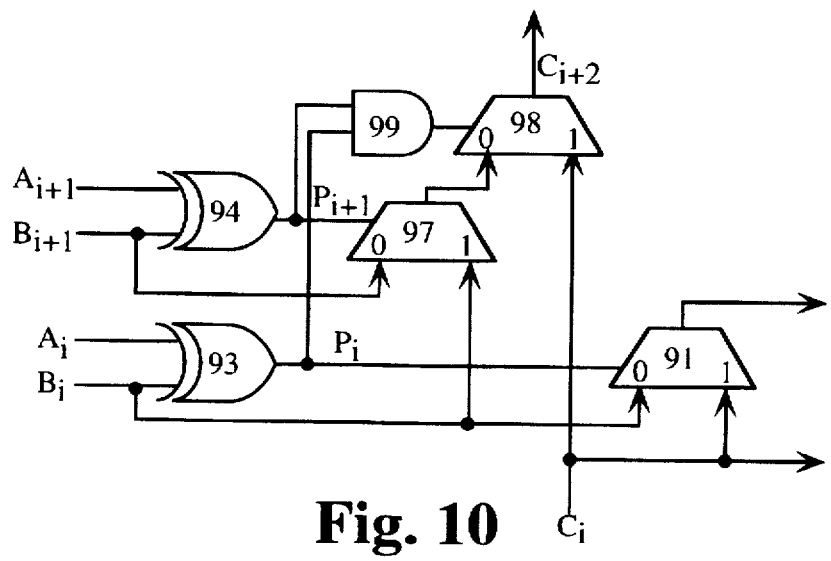

FIGS. 8–10 show schematic diagrams of alternative embodiments of the carry out circuit of the invention. The structure of FIG. 8 is similar to two stages of the structure of FIG. 3, except that the $A_i$ and $A_j$ inputs are shown as separate signals and XOR gates 85 and 86 are shown as being provided in hardware.

FIG. 9 shows the logic reorganized for higher speed. Multiplexer 91, equivalent to multiplexer 81 of FIG. 8 is retained and is used to generate the sum signal in XOR gate 96. However, multiplexer 92 is a three-input multiplexer controlled as shown in the truth table at the right of FIG. 9 by the $P_i$ and $P_{i+1}$ signals, and thus the carry chain delay of multiplexer 91 (or 81 in FIG. 8) is avoided.

The structure of FIG. 10 includes multiplexer 97, which selects between $B_i$ and $B_{i+1}$ as controlled by $P_{i+1}$ to provide an input to two-input multiplexer 98. Also included is AND gate 99, which causes multiplexer 98 to provide the output of multiplexer 97 only when $P_i$ and $P_{i+1}$ are both logical 1. Thus in FIG. 10, the carry chain signal encounters the delay of only one two-input multiplexer for two stages. (Two-input multiplexers are typically faster than three-input multiplexers.)

Figure 11:
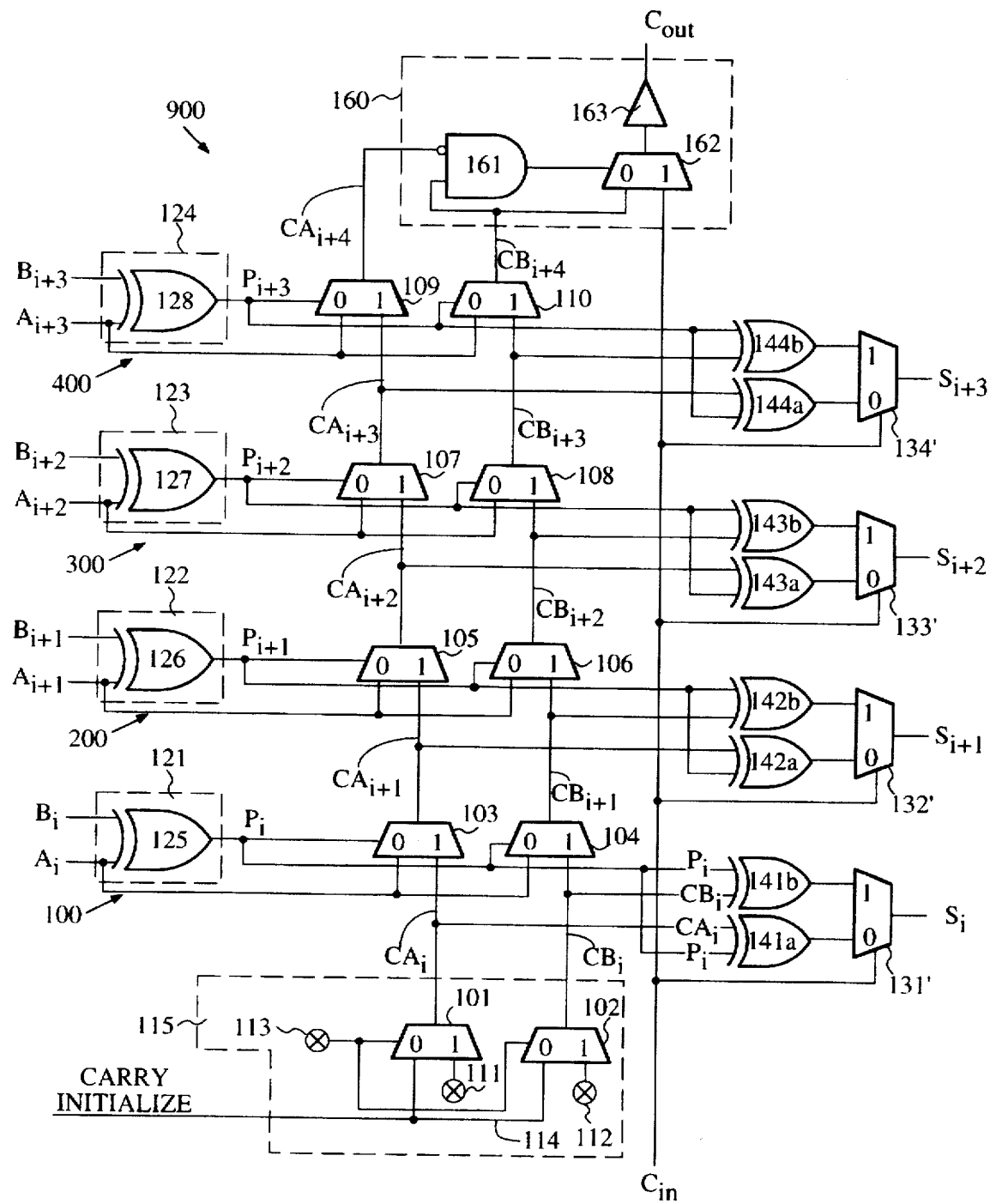
FIG. 11 is a schematic diagram of a 4-bit carry logic structure using two carry chains with conditional sum in accordance with another embodiment of the present invention.

FIG. 11 shows the conditional sum structure according to another embodiment of the invention. The structure of FIG. 11 is similar to the structure of FIG. 6. Equivalent elements have been given the same reference numbers in these two figures. In FIG. 11, instead of the XOR gates 141 through 144 of FIG. 6, the structure includes pairs of XOR gates 141a through 144a and 141b through 144b. These pairs of XOR gates generate conditional sums using the local carry chain signals. For example, XOR gate 141a generates the XOR function of $CA_i$ and $P_i$ and XOR gate 141b generates the XOR function of $CB_i$ and $P_i$. When the carry-in signal $C_{in}$ arrives at multiplexer 131', the final sum $S_i$ is quickly available without the delay of switching XOR gate 141 in FIG. 6. Thus delay is further reduced.

Figure 1:
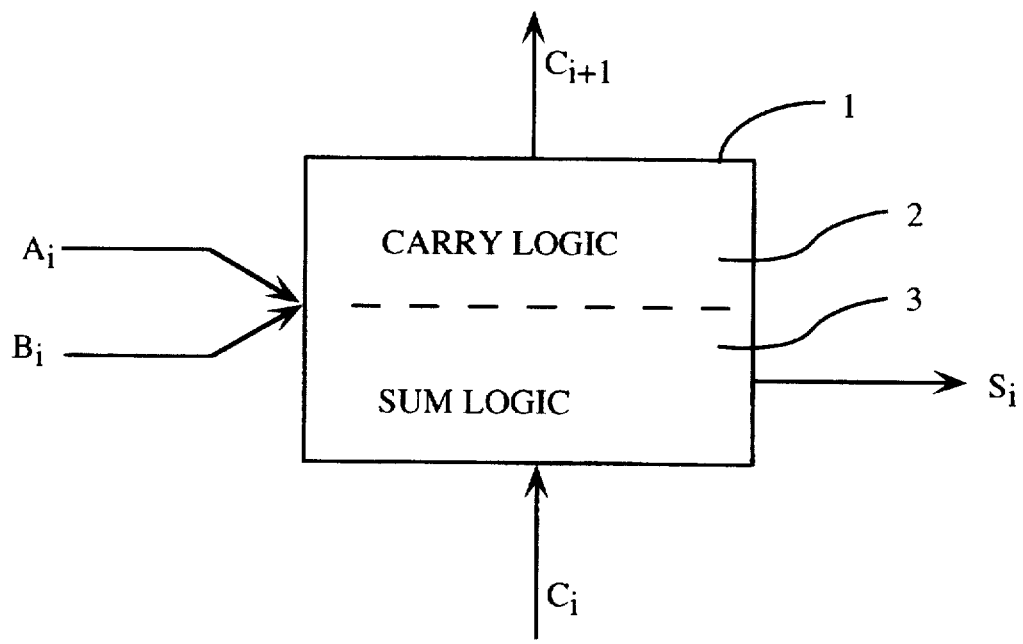
FIGS. 1, 2A, and 2B are schematic diagrams of conventional carry logic circuits.
Figure 2A:
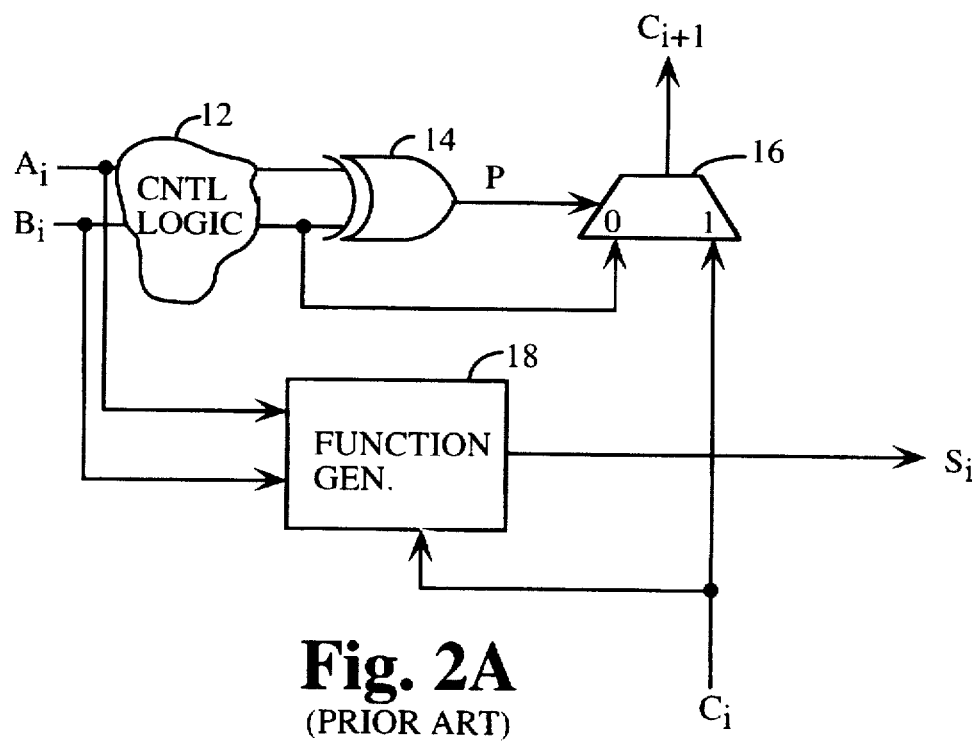
Figure 2B:
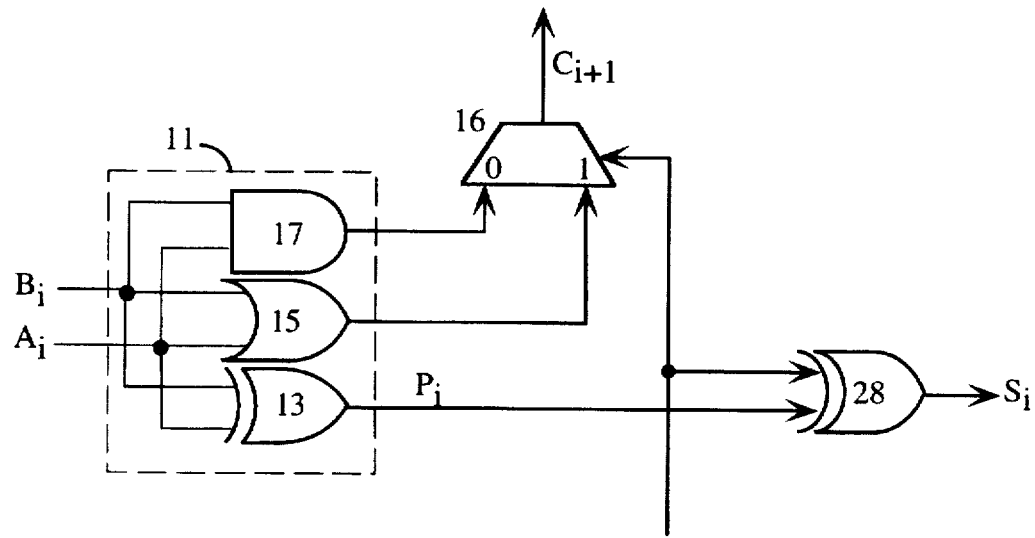
Figure 12:
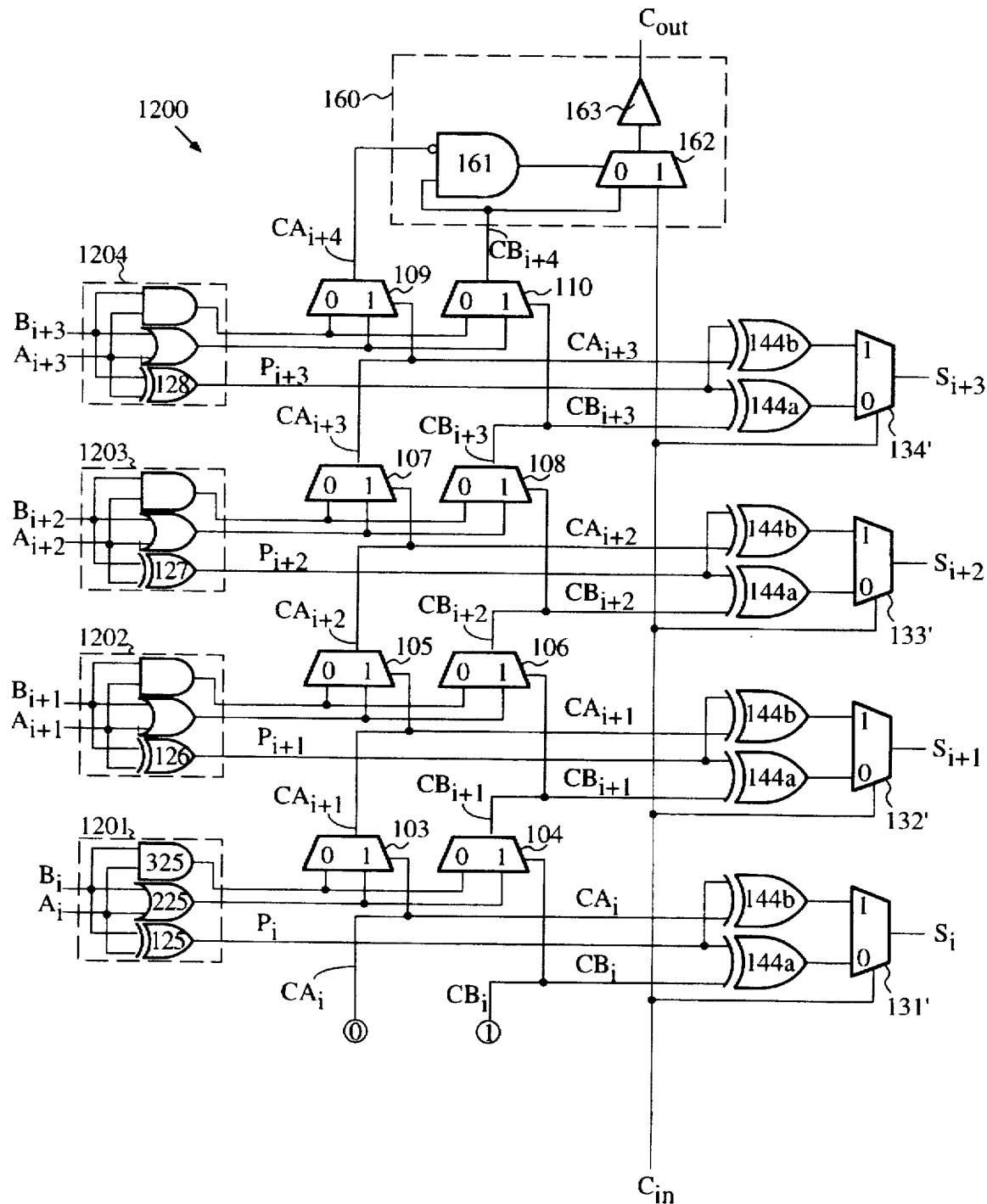
FIG. 12 is a schematic diagram of a 4-bit carry logic structure using two carry chains with conditional sum in which the carry signal is formed from the AND and OR function of bit input signals.
Figure 13:
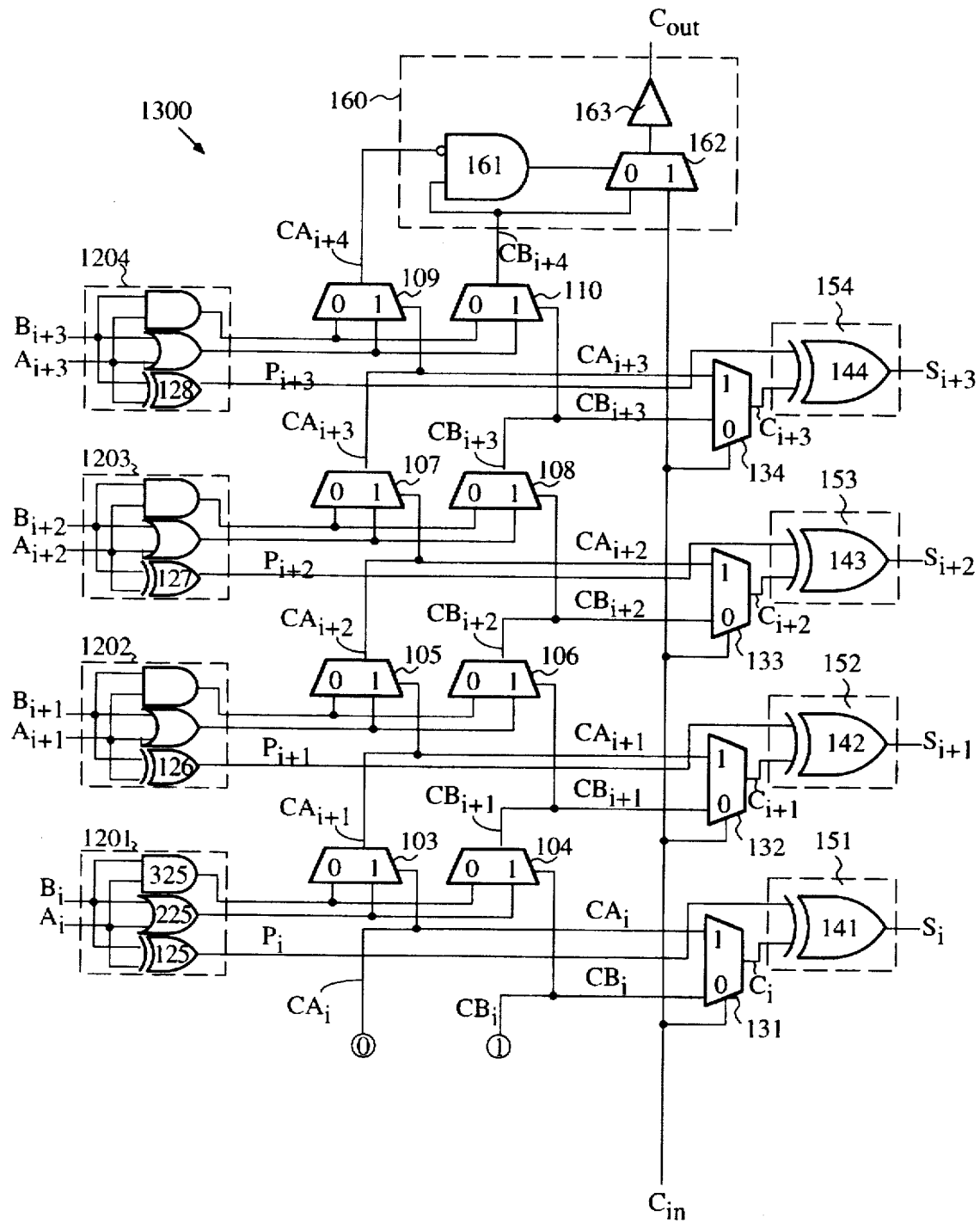
FIG. 13 is a schematic diagram of another 4-bit carry logic structure in which two carry signals are formed from the AND and OR function of bit input signals and where the sums and carry output are formed using carry select.

FIG. 12 shows another structure for generating a fast carry signal in which the conditional sum can be employed. In FIG. 12, logic gates 125, 225, and 325 in logic unit 1201 generate the XOR, OR, and AND functions respectively of input signals $A_i$ and $B_i$. As in earlier embodiments, XOR gate 125 provides the half sum $P_i$. Multiplexer 103 selects one of the AND and OR functions of input signals $A_i$ and $B_i$ as determined by carry-in signal $CA_i$. Operation of multiplexers 103 through 110 is as discussed in connection with FIG. 2B, modified to include two carry chains. Thus the structure of FIG. 12 is another structure for generating fast carry signals when two carry chains are provided. The structure of FIG. 12 includes the same arrangement of XOR gates and multiplexers at the right hand side of the figure for generating the conditional sum as shown in FIG. 11. The structure at the right hand side of FIG. 6 can alternatively be used. FIG. 13 shows such an embodiment. FIG. 12 shows a simplified structure replacing carry initialize structure 115 of FIG. 6 or FIG. 11. This structure is usable in a portion of an FPGA in which user control of the carry chain initialization is not required. As another embodiment, the structure of FIG. 12 can be modified to include the carry initialize structure of FIGS. 6 and 11 to achieve an embodiment in which a carry chain can be initialized. Alternatively, the hard 0 and hard 1 of FIG. 12 can be replaced with signals from memory cells that can be loaded during configuration.

Although the invention has been described in connection with several embodiments, it is understood that this invention is not limited to the embodiments disclosed, but is capable of various modifications which would be apparent to one of ordinary skill in the art. For example, carry logic structures having numbers of bits other than four are contemplated. Thus, the invention is limited only by the following claims.

I claim:

1. A field programmable gate array (FPGA) having at least one carry logic circuit including first and second carry chains, said carry logic circuit comprising:

at least one carry chain stage including a first carry chain stage generating the carry of two input bits and a carry-in bit from a less significant stage in said first carry chain, and a second carry chain stage generating the carry of said two input bits and a carry-in bit from a less significant stage in said second carry chain;

two conditional sum generating means, a first conditional sum generating means generating a first conditional sum from said two input bits and said carry-in bit in said first carry chain, and a second conditional sum generating means generating a second conditional sum from said two input bits and said carry-in bit in said second carry chain;

means for selecting between said first and second carry chains based on a carry logic circuit carry-in signal; and means for selecting between said first and second conditional sums based on said carry logic circuit carry-in signal.

2. An FPGA as in claim 1 wherein each of said two carry chains has four stages.

3. An FPGA as in claim 1 wherein said means for selecting between said first and second carry chains based on a carry logic circuit carry-in signal is a multiplexer.

4. An FPGA as in claim 1 wherein said first conditional sum generating means comprises a first XOR gate receiving the two input bits and a second XOR gate receiving the first XOR gate output and said carry-in bit of said first carry chain, and said second conditional sum generating means comprises said first XOR gate and a third XOR gate receiving the first XOR gate output and said carry-in bit of said second carry chain.

5. An FPGA as in claim 4 wherein said means for selecting between said first and second conditional sums based on said carry logic circuit carry-in signal is a multiplexer.

6. An FPGA as in claim 1 wherein said at least one carry chain stage further includes an XOR gate for generating a half sum of said two input bits and said first and second carry chain stages each comprise a multiplexer controlled by said XOR gate and receiving inputs from one of said input bits and a carry-in signal from a less significant stage.

7. An FPGA as in claim 1 wherein said at least one carry chain stage further includes AND, OR, and XOR gates for generating respectively the AND, OR, and XOR functions of said two input bits and said first and second carry chain stages each comprise a multiplexer controlled by a carry-in signal from a less significant stage and receiving as input signals the output signals from said AND gate and said OR gate.

* * * * *